(12) United States Patent
Fu

(10) Patent No.: US 8,837,129 B2
(45) Date of Patent: Sep. 16, 2014

(54) ELECTRONIC DEVICE CASE

(71) Applicant: Wistron Corporation, New Taipei (TW)

(72) Inventor: Sih-Ren Fu, New Taipei (TW)

(73) Assignee: Wistron Corporation, New Taipei (TW)

( * ) Notice: Subject to any disclaimer, the term of this patent is extended or adjusted under 35 U.S.C. 154(b) by 162 days.

(21) Appl. No.: 13/648,654

(22) Filed: Oct. 10, 2012

(65) Prior Publication Data
US 2013/0241372 A1 Sep. 19, 2013

(30) Foreign Application Priority Data
Mar. 16, 2012 (TW) ............................. 101109184 A

(51) Int. Cl.
G06F 1/16 (2006.01)
H05K 5/00 (2006.01)
H05K 7/00 (2006.01)
A47B 81/00 (2006.01)
A47B 97/00 (2006.01)

(52) U.S. Cl.
USPC ................................. 361/679.02; 312/223.02

(58) Field of Classification Search
CPC ... H05K 7/1487; H05K 5/0221; E05B 65/006
USPC ............ 312/223.1, 223.2, 265.5; 361/679.01, 361/679.58, 679.02; 292/1, 137, 138, 292/DIG. 11
See application file for complete search history.

(56) References Cited

U.S. PATENT DOCUMENTS

| | | | | |
|---|---|---|---|---|
| 3,478,919 A * | 11/1969 | Turpen | ........................... | 220/324 |
| 4,672,510 A * | 6/1987 | Castner | .................... | 361/679.32 |
| 4,821,055 A * | 4/1989 | Loose et al. | ................... | 396/517 |
| 6,457,788 B1 * | 10/2002 | Perez et al. | ................. | 312/265.5 |
| 6,711,009 B2 * | 3/2004 | Lee et al. | .................. | 361/679.58 |
| 6,929,338 B2 * | 8/2005 | Chang | ......................... | 312/223.2 |
| 7,325,846 B2 * | 2/2008 | Smith et al. | ................ | 292/336.3 |
| 7,420,812 B2 * | 9/2008 | Chen et al. | ..................... | 361/724 |
| 7,480,148 B2 * | 1/2009 | Chen et al. | ..................... | 361/726 |
| 7,735,669 B2 * | 6/2010 | Liang | ........................... | 220/4.21 |
| 7,984,935 B2 * | 7/2011 | Luo et al. | ......................... | 292/80 |

(Continued)

FOREIGN PATENT DOCUMENTS

TW M351383 U 2/2009
TW M419371 U1 12/2011

OTHER PUBLICATIONS

Office action dated Feb. 27, 2014 for Taiwanese counterpart application No. 101109184 along with an English translation of marked sections.

*Primary Examiner* — Darnell Jayne
*Assistant Examiner* — Kimberley S Wright
(74) *Attorney, Agent, or Firm* — Whyte Hirschboeck Dudek S.C.

(57) ABSTRACT

An electronic device case includes a casing body formed with an opening, a blocking mechanism disposed on the casing body, a cover disposed on the casing body and covering the opening, and an engaging component mounted on the cover. The blocking mechanism is formed with an engaging groove facing a direction opposite to the opening. The engaging component is adapted to be moved relative to the cover in the direction opposite to the opening, and includes a connecting plate removably received in the engaging groove, and an engaging plate extending obliquely from the connecting plate toward the direction opposite to the opening and angularly and removably engaging the engaging groove, so that the cover is removably positioned on the casing body.

6 Claims, 6 Drawing Sheets

(56) References Cited

U.S. PATENT DOCUMENTS

| | | | |
|---|---|---|---|
| 8,254,091 B2* | 8/2012 | Yang | 361/679.01 |
| 2003/0227740 A1* | 12/2003 | Lee et al. | 361/683 |
| 2005/0088068 A1* | 4/2005 | Chang | 312/265.5 |
| 2011/0147387 A1* | 6/2011 | Greenwood et al. | 220/326 |
| 2012/0248791 A1* | 10/2012 | Chu | 292/128 |
| 2014/0062273 A1* | 3/2014 | Lee et al. | 312/223.1 |

* cited by examiner

ELECTRONIC DEVICE CASE

CROSS-REFERENCE TO RELATED APPLICATION

This application claims priority of Taiwanese Patent Application No. 101109184, filed on Mar. 16, 2012, the disclosure of which is incorporated herein by reference.

BACKGROUND OF THE INVENTION

1. Field of the Invention

The invention relates to an electronic device case, and more particularly to an electronic device case for a rack server or a blade server.

2. Description of the Related Art

In a rack server or a blade server, multiple host computers are disposed in a cabinet for centralized management. Compared with a conventional pedestal server, the rack server or the blade server occupies a relatively smaller space. Components of the rack server or the blade server, such as a motherboard and a hard disk, are disposed in an elongated case that facilitates removal of these components. The case is enclosed by a top cover for protecting the components of the rack server or the blade server disposed in the case. Since replacement of a component of the rack server or the blade server requires removal of the top cover from the case, the top cover of the case needs to be installed and removed conveniently and not detached from the case unexpectedly.

Referring to FIG. 1, a conventional engaging mechanism 13 for locking a top cover 11 to a case 12 includes a latch 14 disposed on of the top cover 11, and a barb 15 disposed above a recess 122 in a side wall 121 of the case 12. The recess 122 has an opening 123 adjacent to the barb 15. When it is desired to lock the top cover 11 to the case 12, the latch 14 is moved into the recess 122 through the opening 123, and then, the latch 14 is pressed downwardly and the top cover is pushed horizontally toward a left direction of FIG. 1. As a result, the latch 14 is moved to and engages a left side of the barb 15. When it is desired to remove the top cover from the case 12, the latch 14 is pressed downwardly so as to disengage from the barb 15, and then, the top cover is pulled toward a right direction of FIG. 1 so as to remove the latch 147 from the recess 122 through the opening 123.

Referring to FIG. 2, since the latch 14 compactly contacts the barb 15 at a right-angled corner of the barb 15, a friction force between the latch 14 and the barb 15 is relatively great. Accordingly, when the latch 14 is pressed for removing the top cover from the case 12, the latch 14 and the barb 15 may generate noise and may be worn due to the friction force therebetween.

Therefore, in order to solve the above drawbacks, there is provided another conventional engaging mechanism 13 as shown in FIG. 3. A latch 16 of the engaging mechanism 13 of FIG. 3 has a curved end in contact with the barb 15. Thus, contact area between the latch 16 and the barb 15 is reduced, and a friction force therebetween is reduced accordingly. However, when the latch 16 is located at the left side of the barb 15 and engages the barb 15, the latch 16 abuts against the barb 15 and a reaction force from the barb 15 generates a torque exerting on the latch 16 as shown by a clockwise arrow in FIG. 3 while the top cover is forced by an external force to move toward a right direction of FIG. 3 without pressing the latch 16. At this time, since the end surface of the latch 16 is curved and results in a relatively small friction force, the latch 16 may easily move downwardly relative to the barb 15 due to the torque and may even move past the barb 15 to unexpectedly release the top cover.

SUMMARY OF THE INVENTION

Therefore, an object of the present invention is to provide an electronic device case that can be installed and removed conveniently and that has a stable structure. Accordingly, an electronic device case of the present invention comprises a casing body, a blocking mechanism, a cover, and an engaging component.

The casing body includes two side walls that jointly define an opening. The blocking mechanism is disposed on one of the side walls of the casing body and is formed with an engaging groove that faces a direction opposite to the opening. The cover is slidably and removably disposed on the side walls and covers the opening of the casing body. The engaging component is mounted on the cover and is adapted to be pressed to move relative to the cover in the direction opposite to the opening. The engaging component includes a connecting plate that is removably received in the engaging groove of the blocking mechanism, and an engaging plate that extends obliquely from one end of the connecting plate toward the direction opposite to the opening and that angularly and removably engages and abuts against the engaging groove, so that the cover is removably positioned on the casing body.

The blocking mechanism includes a pair of spaced-apart inner surfaces cooperatively defining a recess therebetween, and a blocking rod that extends from one of the inner surfaces toward the other one of the inner surfaces and that is spaced apart from the other one of the inner surfaces so as to define an access therebetween. The recess is located at the direction opposite to the opening with respect to the engaging groove, faces the opening, and is in spatial communication with the engaging groove and the opening. The connecting plate and the engaging plate are adapted to enter the recess through the access and then to slide into the engaging groove when the engaging component is pressed and then the cover is slid.

The blocking mechanism further includes a blocking plate that extends from the blocking rod in the direction opposite to the opening, that is disposed on a free end of the blocking rod facing and being spaced apart from the other one of the inner surfaces, that is connected to the blocking rod in a barb shape, that cooperates with the blocking rod and the one of the inner surfaces to define the engaging groove, and that has a blocking edge adjacent to and extending from the blocking rod and that faces the one of the inner surfaces. The engaging plate removably engages and abuts against the blocking edge.

The blocking plate further has a guiding edge extending obliquely from the free end of the blocking rod toward the engaging groove in the direction opposite to the opening. When the connecting plate and the engaging plate are moved into the recess through the access and the cover slides relative to the casing body in a first direction along the blocking rod and opposite to the access, the guiding edge of the blocking plate is adapted to guide the connecting plate to slide into the engaging groove.

The blocking edge of the blocking plate extends vertically from the blocking rod in the direction opposite to the opening. The connecting plate and the engaging plate are adapted to move in the direction opposite to the opening and to disengage from the blocking plate when the engaging component is pressed and bent in the direction opposite to the opening, and are adapted to be aligned with the access when the cover is slid relative to the casing body in a second direction opposite to the first direction so that the cover is removed from the casing body.

A forced region is formed at a corner between the blocking edge and the blocking rod, and the engaging plate abuts against the forced region.

The engaging plate has a folded part at one end engaging and abutting against the engaging groove, and the folded part is compactly folded along the engaging plate and toward the connecting plate and is formed with a curved end surface The connecting plate has a folded part at the other end opposite to the engaging plate, and the folded part is compactly folded along the connecting plate and toward the engaging plate and is formed with a curved end surface.

BRIEF DESCRIPTION OF THE DRAWINGS

Other features and advantages of the present invention will become apparent in the following detailed description of one embodiment with reference to the accompanying drawings, of which.

DETAILED DESCRIPTION OF THE EMBODIMENT

Figure 1:
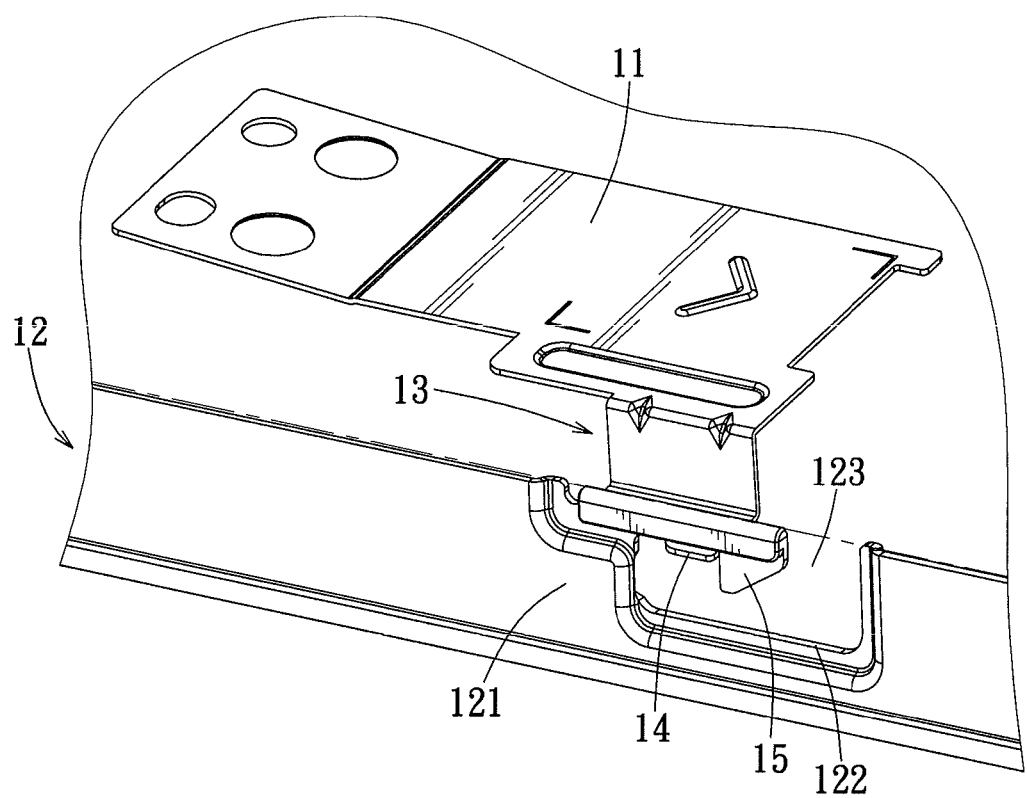
FIG. 1 is a fragmentary perspective view of a conventional engaging mechanism for locking a top cover to a case.
Figure 2:
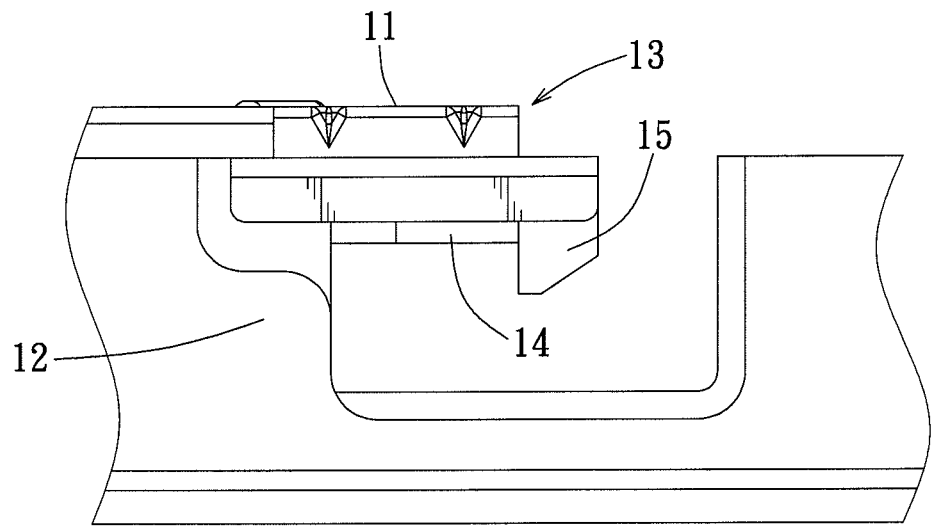
FIG. 2 is a fragmentary side view illustrating the conventional engaging mechanism of FIG. 1.
Figure 3:
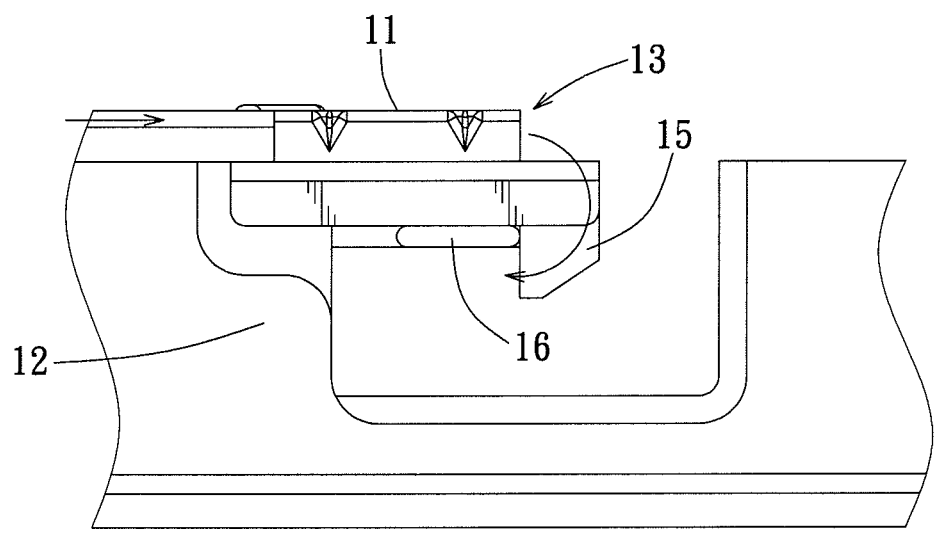
FIG. 3 is a fragmentary side view illustrating another conventional engaging mechanism for locking a top cover to a case.
Figure 4:
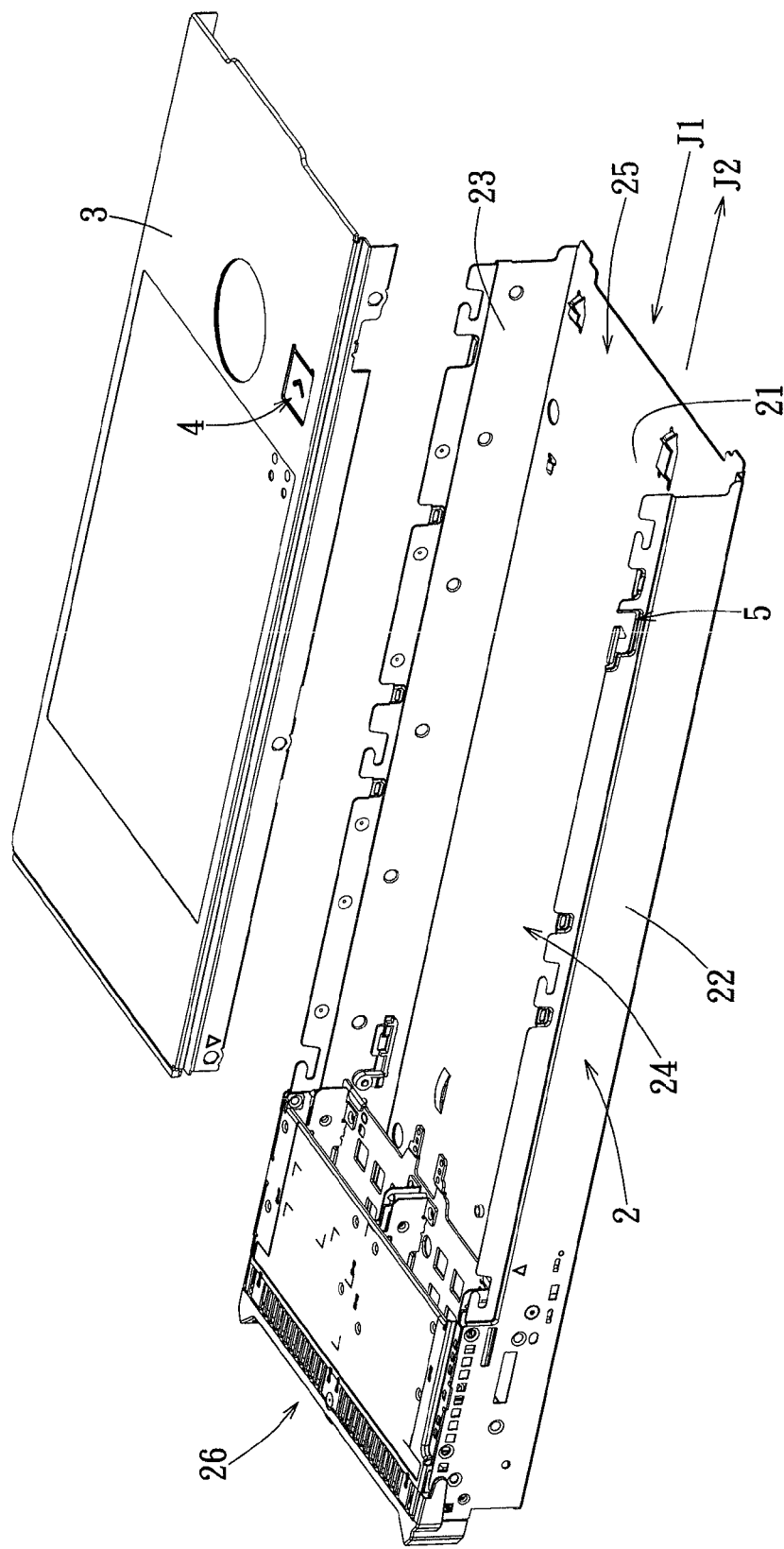
FIG. 4 is an exploded perspective view of an embodiment of an electronic device case of the present invention.
Figure 5:
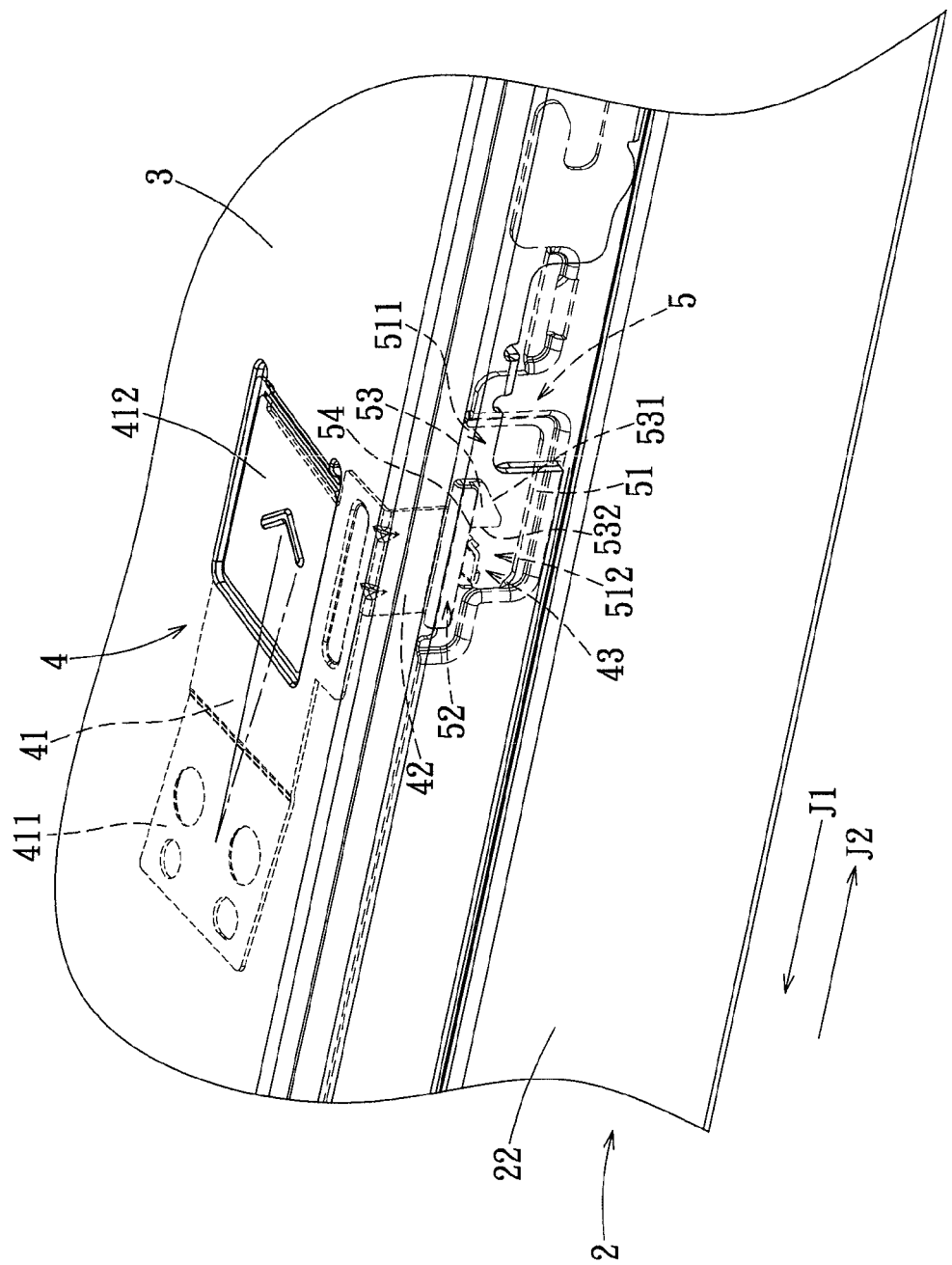
FIG. 5 is a fragmentary perspective view illustrating detailed components of the electronic device case of the embodiment.
Figure 6:
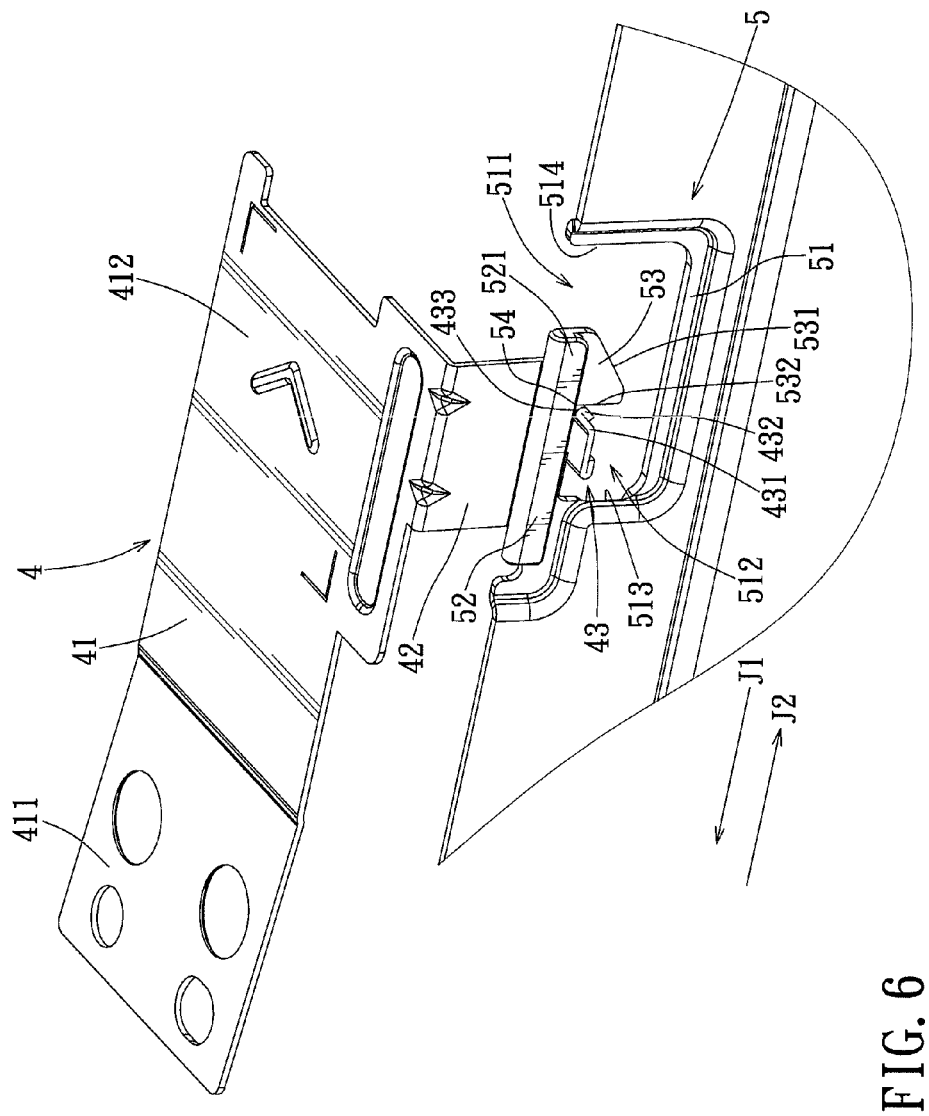
FIG. 6 is an enlarged view of FIG. 5 illustrating assembly relationship between an engaging component and a blocking mechanism, where a cover of the electronic device case is omitted.

Referring to FIGS. 4 to 6, an embodiment of an electronic device case of the present invention is configured to be used as a case of a rack server or a blade server, and includes a casing body 2, a blocking mechanism 5, a cover 3, and an engaging component 4.

The casing body 2 includes a bottom wall 21, and two side walls 22, 23 located respectively on two opposite sides of the bottom wall 21 and jointly defining a top opening 24 opposite to the bottom wall 21. Components of the server, such as a motherboard, may be received in a space between the two side walls 22, 23, and may be repaired through the top opening 24. In addition, the casing body 2 has an open end 25 (at a right side in FIG. 4) that is not closed, and a closed end 26 (at a left side in FIG. 4) that is opposite to the open end 25 and that is closed by, for example, a hard disk of the server.

The blocking mechanism 5 is disposed on the side wall 22 of the casing body 2, and is formed with a recess 51 in the side wall 22. The blocking mechanism 5 includes a pair of spaced-apart inner surfaces 513, 514, a blocking rod 52, and a blocking plate 53. One of the inner surfaces 513 is away from the open end 25, and the other one of the inner surfaces 514 is away from the closed end 26. The inner surfaces 513, 514 cooperatively define the recess 51 therebetween. The blocking rod 52 extends horizontally from the inner surface 513 toward the open end 25, and is spaced apart from the inner surface 514 so as to define an access 511 therebetween. The blocking plate 53 is disposed on a free end 521 of the blocking rod 52 that faces and is spaced apart from the inner surface 514. The blocking rod 52 and the blocking plate 53 are connected to each other in a barb shape. The blocking plate 53 has a guiding edge 531 and a blocking edge 532. The guiding edge 531 is adjacent to the access 511, and extends obliquely and downwardly from the access 511 in a direction away from the access 511. The blocking edge 532 is away from the access 511, and extends vertically and downwardly from the blocking rod 52. The blocking edge 532, the inner surface 513, and the blocking rod 52 jointly define an engaging groove 512. In particular, a forced region 54 is formed at a corner between the blocking edge 532 and the blocking rod 52.

The cover 3 is slidable laterally along the two side walls 22, 23, and is adapted to cover the top opening 24 of the casing 2.

The engaging component 4 includes an operating plate 41, an upright plate 42, a connecting plate 43, and an engaging plate 431. The operating plate 41 has a first end 411 fixed to a bottom surface of the cover 3, and a second end 412 exposed from the cover 3. The upright plate 42 is connected to the second end 412 of the operating plate 41, and extends toward the bottom wall 21 of the casing body 2. The connecting plate 43 extends outwardly from a lower part of the upright plate 42. The engaging plate 431 extends obliquely and upwardly from one end of the connecting plate 43 adjacent to the open end 25 in a direction away from the closed end 26. When it is desired to cover the top opening 24 of the casing body 2 using the cover 3, the connecting plate 43 and the engaging plate 431 are moved into the recess 51 through the access 511, and then, the cover 3 is slid relative to the casing body 2 in a first direction (J1) toward the closed end 26. At this time, the guiding edge 532 of the blocking plate 53 is adapted to guide the connecting plate 43 to slide into the engaging groove 512. As a result, the connecting plate 43 is removably received in the engaging groove 512, and the engaging plate 431 removably engages and abuts against the forced region 54 between the blocking edge 532 of the blocking plate 53 and the blocking rod 52 so as to secure the cover 3 to the casing body 2.

When the operating plate 41 is pressed downwardly, the connecting plate 43 moves downwardly to disengage the engaging plate 431 from the blocking plate 53. Then, the cover 3 is slid relative to the casing body 2 in a second direction (J2) opposite to the first direction (J1) toward the open end 25 of the casing body 2, so that the connecting plate 43 and the engaging plate 431 move in the second direction (J2) to a position below the access 511. At this time, the cover 3 may be removed upwardly from the casing body 2.

Figure 7:
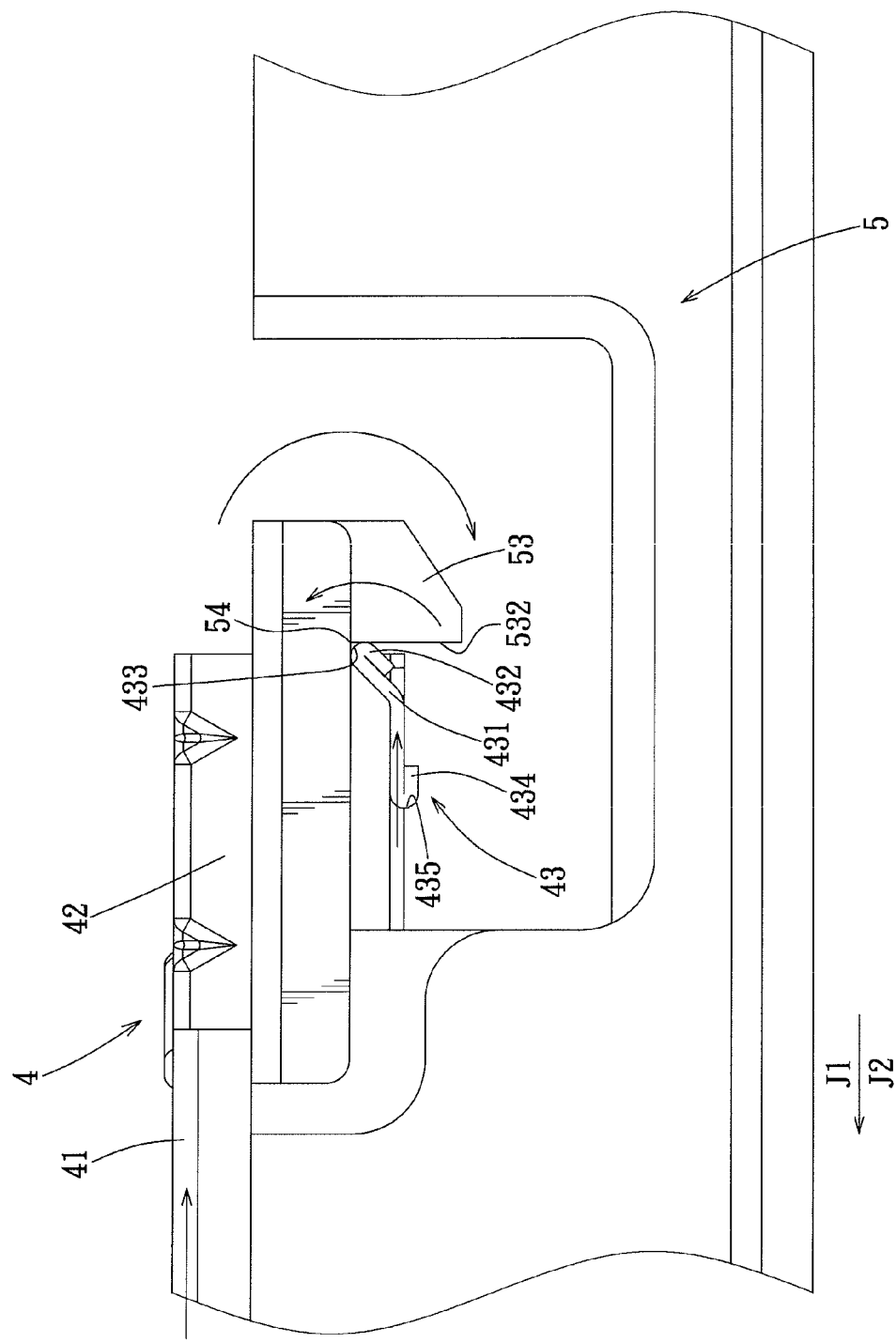
FIG. 7 is an enlarged side view of FIG. 6.

Referring further to FIG. 7, in this embodiment, the engaging plate 431 has a folded part 432 at the end engaging and abutting against the engaging groove 512, and the folded part 432 is compactly folded along the engaging plate 431 and toward the connecting plate 43 and is formed with a curved end surface 433. In this way, when the connecting plate 43 slides upwardly and downwardly relative to the blocking edge 532 of the blocking plate 53, a contact area between the engaging plate 431 and the blocking edge 532 of the blocking plate 53 can be reduced, so as to alleviate or prevent noise and wear of the engaging plate 431 and the blocking plate 53. As a result, the connecting plate 43 slides into the engaging groove 512 more easily, and the engaging plate 431 will not be stuck due to an excessive friction force with the blocking edge 532 of the blocking plate 53, thereby preventing incomplete engagement. It should be noted that, since the engaging plate 431 abuts obliquely against the forced region 54, the engaging plate 431 contacts the forced region 54 only at two points, that is to say, the engaging plate 431 contacts the blocking edge 532 of the blocking plate 53 only at one point. Therefore, the end of the engaging plate 431 engaging the blocking edge 532 is not limited to the curved end surface 433 of this embodiment, and may alternatively be a square end surface, as long as the contact area between the engaging plate 431 and the blocking edge 532 can be reduced. Moreover, the connecting plate 43 also has a folded part 434 at the other end opposite to the engaging plate 431, and the folded part 434 is compactly folded along the connecting plate 43 and toward the engaging plate 431 and is formed with a curved end surface 435, thereby alleviating or preventing noise and wear of the connecting plate 43 and the blocking plate 53 when the other end of the connecting plate 43 slides along the guiding edge 531 of the blocking plate 53.

Furthermore, as shown in FIGS. 5 and 7, when the operating plate 41 is not pressed and the cover 3 is forced to move in the second direction (J2), the operating plate 41 is subjected to a force from the cover 3 toward the second direction (J2) at the junction between the operating plate 41 and the bottom surface of the cover 3. The force is transmitted to the engaging plate 431 through the upright plate 42 and the connecting plate 43, and is applied to the forced region 54, so that the forced region 54 generates a reaction force to the engaging plate 431. The reaction force generated by the forced region 54 acts on the operating plate 41 through the connecting plate 43 and the upright plate 42 in sequence. Since the reaction force is applied to the junction between the operating plate 41 and the bottom surface of the cover 3 at a position higher than the forced region 54, the reaction force from the forced region 54 generates a torque to the operating plate 41 as shown by a clockwise arrow in FIG. 7. Meanwhile, since the reaction force is applied to the junction between the connecting plate 43 and the upright plate 42 at a position lower than the forced region 54, the reaction force generates a torque to the connecting plate 43 as shown by a counterclockwise arrow in FIG. 7, so as to counteract the clockwise torque. In this way, the engaging plate 431 may stably engage and abut against the forced region 54, thereby preventing the cover 3 from being undesirably released from the casing body 2.

Furthermore, it should be noted that, in other embodiments, the guiding edge 531 of the blocking plate 53 may be an upright edge. In this case, when it is desired to move the connecting plate 43 of the engaging component 4 into the engaging groove 512 through the access 511, the operating plate 41 can be continuously pressed down so as to enable the connecting plate 43 to move past the blocking plate 53.

To sum up, according to the embodiment, by virtue of the engaging plate 431 extending obliquely and upwardly from one end of the connecting plate 43, when the operating plate 41 is not pressed and the cover 3 is forced to move in the second direction (J2), the reaction force from the forced region 54 against the engaging plate 431 can generate the torque to the connecting plate 43 as shown by the counterclockwise arrow in FIG. 7, so as to counteract the torque generated by the forced region 54 to the operating plate 41 as shown by the clockwise arrow in FIG. 7. Thus, the engaging plate 431 may stably engage the forced region 54, thereby preventing the cover 3 from being undesirably removed from the casing body 2. Moreover, since the engaging plate 431 contacts the blocking edge 532 of the blocking plate 53 at a single point only, problems such as incomplete engagement, noise and wear can be avoided.

While the present invention has been described in connection with what is considered the most practical embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An electronic device case, comprising:
   a casing body including two side walls that jointly define an opening;
   a blocking mechanism disposed on one of said side walls of said casing body and formed with an engaging groove that faces a direction opposite to said opening, said blocking mechanism including
   a pair of spaced-apart inner surfaces cooperatively defining a recess therebetween, said recess being located at the direction opposite to said opening with respect to said engaging groove, facing said opening, and being in spatial communication with said engaging groove and said opening, and
   a blocking rod extending from one of said inner surfaces toward the other one of said inner surfaces, and spaced apart from said other one of said inner surfaces so as to define an access therebetween;
   a cover slidably and removably disposed on said side walls and covering said opening of said casing body; and
   an engaging component mounted on said cover and adapted to be pressed to move relative to said cover in the direction opposite to said opening, said engaging component including a connecting plate that is removably received in said engaging groove of said blocking mechanism, and an engaging plate that extends obliquely from one end of said connecting plate toward the direction opposite to said opening and that angularly and removably engages and abuts against said engaging groove, so that said cover is removably positioned on said casing body;
   wherein said connecting plate and said engaging plate are adapted to enter said recess through said access and then to slide into said engaging groove when said engaging component is pressed and then said cover is slid;
   wherein said blocking mechanism further includes a blocking plate that extends from said blocking rod in the direction opposite to said opening, that is disposed on a free end of said blocking rod facing and being spaced apart from said other one of said inner surfaces, that is connected to said blocking rod in a barb shape, that cooperates with said blocking rod and said one of said inner surfaces to define said engaging groove, and that has a blocking edge adjacent to and extending from said blocking rod and that faces said one of said inner surfaces;
   wherein said engaging plate removably engages and abuts against said blocking edge.

2. The electronic device case of claim 1, wherein said blocking plate further has a guiding edge extending obliquely from said free end of said blocking rod toward said engaging groove in the direction opposite to said opening;
   wherein, when said connecting plate and said engaging plate are moved into said recess through said access and said cover slides relative to said casing body in a first direction along said blocking rod and opposite to said access, said guiding edge of said blocking plate is adapted to guide said connecting plate to slide into said engaging groove.

3. The electronic device case of claim 2, wherein said blocking edge of said blocking plate extends vertically from said blocking rod in the direction opposite to said opening;
   wherein said connecting plate and said engaging plate are adapted to move in the direction opposite to said opening and to disengage from said blocking plate when said engaging component is pressed and bent in the direction opposite to said opening, and are adapted to be aligned with said access when said cover is slid relative to said casing body in a second direction opposite to the first direction so that said cover is removed from said casing body.

4. The electronic device case of claim 1, wherein a forced region is formed at a corner between said blocking edge and said blocking rod, and said engaging plate abuts against said forced region.

5. The electronic device case of claim 1, wherein said engaging plate has a folded part at one end engaging and abutting against said engaging groove, and said folded part is compactly folded along said engaging plate and toward said connecting plate and is formed with a curved end surface.

6. The electronic device case of claim 1, wherein said connecting plate has a folded part at the other end opposite to said engaging plate, and said folded part is compactly folded along said connecting plate and toward said engaging plate and is formed with a curved end surface.

* * * * *